United States Patent
Oikawa et al.

(10) Patent No.: US 11,316,095 B2
(45) Date of Patent: Apr. 26, 2022

(54) MAGNETIC DEVICE WHICH IMPROVES WRITE ERROR RATE WHILE MAINTAINING RETENTION PROPERTIES

(71) Applicant: KIOXIA CORPORATION, Tokyo (JP)

(72) Inventors: Tadaaki Oikawa, Seoul (KR); Young Min Eeh, Seongnam-si (KR); Kenichi Yoshino, Seongnam-si (KR); Eiji Kitagawa, Seoul (KR); Kazuya Sawada, Seoul (KR); Taiga Isoda, Seoul (KR)

(73) Assignee: KIOXIA CORPORATION, Tokyo (JP)

( * ) Notice: Subject to any disclaimer, the term of this patent is extended or adjusted under 35 U.S.C. 154(b) by 127 days.

(21) Appl. No.: 16/816,880

(22) Filed: Mar. 12, 2020

(65) Prior Publication Data
US 2021/0074908 A1 Mar. 11, 2021

(30) Foreign Application Priority Data
Sep. 11, 2019 (JP) .............................. JP2019-165228

(51) Int. Cl.
*H01L 43/02* (2006.01)
*H01L 27/22* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ....... H01L 43/02; H01L 27/224; H01L 43/10; H01L 43/12; G11C 11/161;
(Continued)

(56) References Cited

U.S. PATENT DOCUMENTS 8,854,876 B2  10/2014  Uchida et al.
9,006,704 B2   4/2015  Jan et al.
(Continued)

FOREIGN PATENT DOCUMENTS

JP        5429480 B2     2/2014

OTHER PUBLICATIONS

U.S. Appl. No. 16/568,123; First Named Inventor: Tadaaki Oikawa; Title: "Magnetoresistive Element and Magnetic Memory Device"; filed Sep. 11, 2019.
(Continued)

*Primary Examiner* — Jami Valentine Miller
(74) *Attorney, Agent, or Firm* — Holtz, Holtz & Volek PC

(57) ABSTRACT

According to one embodiment, a magnetic device includes a layer stack. The layer stack includes a first ferromagnetic layer, a second ferromagnetic layer, a first nonmagnetic layer between the first ferromagnetic layer and the second ferromagnetic layer, and a second nonmagnetic layer. The first ferromagnetic layer is interposed between the second nonmagnetic layer and the first nonmagnetic layer. The first nonmagnetic layer and the second nonmagnetic layer contain a magnesium oxide (MgO). The first ferromagnetic layer contains a higher amount of boron (B) at an interface with the first nonmagnetic layer than at an interface with the second nonmagnetic layer.

20 Claims, 13 Drawing Sheets

(51) Int. Cl.
*H01L 43/10* (2006.01)
*H01L 43/12* (2006.01)
*G11C 11/16* (2006.01)
*H01F 10/32* (2006.01)

(52) U.S. Cl.
CPC ..... *H01F 10/3254* (2013.01); *H01F 10/3268* (2013.01); *H01L 27/224* (2013.01); *H01L 43/10* (2013.01); *H01L 43/12* (2013.01); *H01F 10/329* (2013.01); *H01F 10/3286* (2013.01)

(58) Field of Classification Search
CPC ............. G11C 11/1659; H01F 10/3254; H01F 10/3268; H01F 10/3286; H01F 10/329
See application file for complete search history.

(56) References Cited

U.S. PATENT DOCUMENTS

| | | | |
|---|---|---|---|
| 9,184,374 B2 | 11/2015 | Sawada et al. | |
| 9,269,890 B2 | 2/2016 | Nakayama et al. | |
| 9,293,695 B2 | 3/2016 | Ueda et al. | |
| 9,305,576 B2 | 4/2016 | Noma | |
| 9,608,199 B1 | 3/2017 | Kitagawa | |
| 9,620,561 B2 | 4/2017 | Nagase et al. | |
| 9,741,928 B2 | 8/2017 | Ueda et al. | |
| 9,947,862 B2 | 4/2018 | Watanabe et al. | |
| 10,103,318 B2 | 10/2018 | Watanabe et al. | |
| 10,263,178 B2 | 4/2019 | Sawada et al. | |
| 10,388,343 B2 | 8/2019 | Oikawa et al. | |
| 10,510,950 B2 | 12/2019 | Watanabe et al. | |
| 2015/0249202 A1* | 9/2015 | Siddik | H01L 43/12 257/421 |
| 2015/0295164 A1* | 10/2015 | Sandhu | H01L 43/10 257/421 |
| 2017/0263679 A1 | 9/2017 | Ozeki et al. | |
| 2018/0205006 A1 | 7/2018 | Watanabe et al. | |
| 2018/0269043 A1 | 9/2018 | Ueda et al. | |
| 2018/0277745 A1 | 9/2018 | Oikawa et al. | |
| 2018/0323371 A1 | 11/2018 | Liu et al. | |
| 2019/0131519 A1* | 5/2019 | Ikegawa | H01F 10/3254 |
| 2020/0075671 A1 | 3/2020 | Ozeki et al. | |
| 2020/0082857 A1 | 3/2020 | Eeh et al. | |
| 2020/0091410 A1* | 3/2020 | Kitagawa | H01L 43/02 |
| 2021/0074908 A1* | 3/2021 | Oikawa | G11C 11/1673 |

OTHER PUBLICATIONS

U.S. Appl. No. 16/813,827; First Named Inventor: Taiga Isoda; Title: "Magnetoresistive Memory Device"; filed Mar. 10, 2020.

* cited by examiner

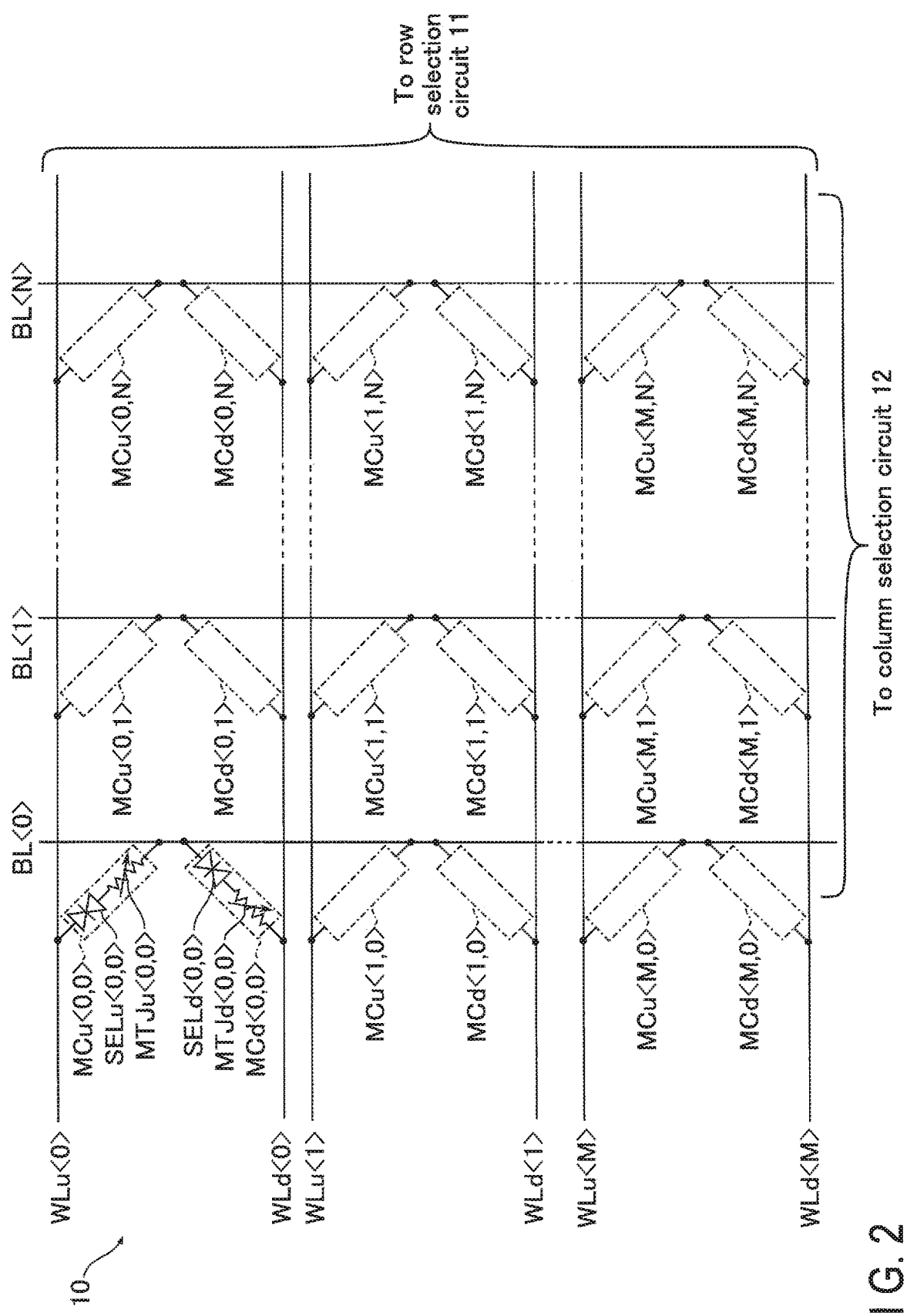
F I G. 2

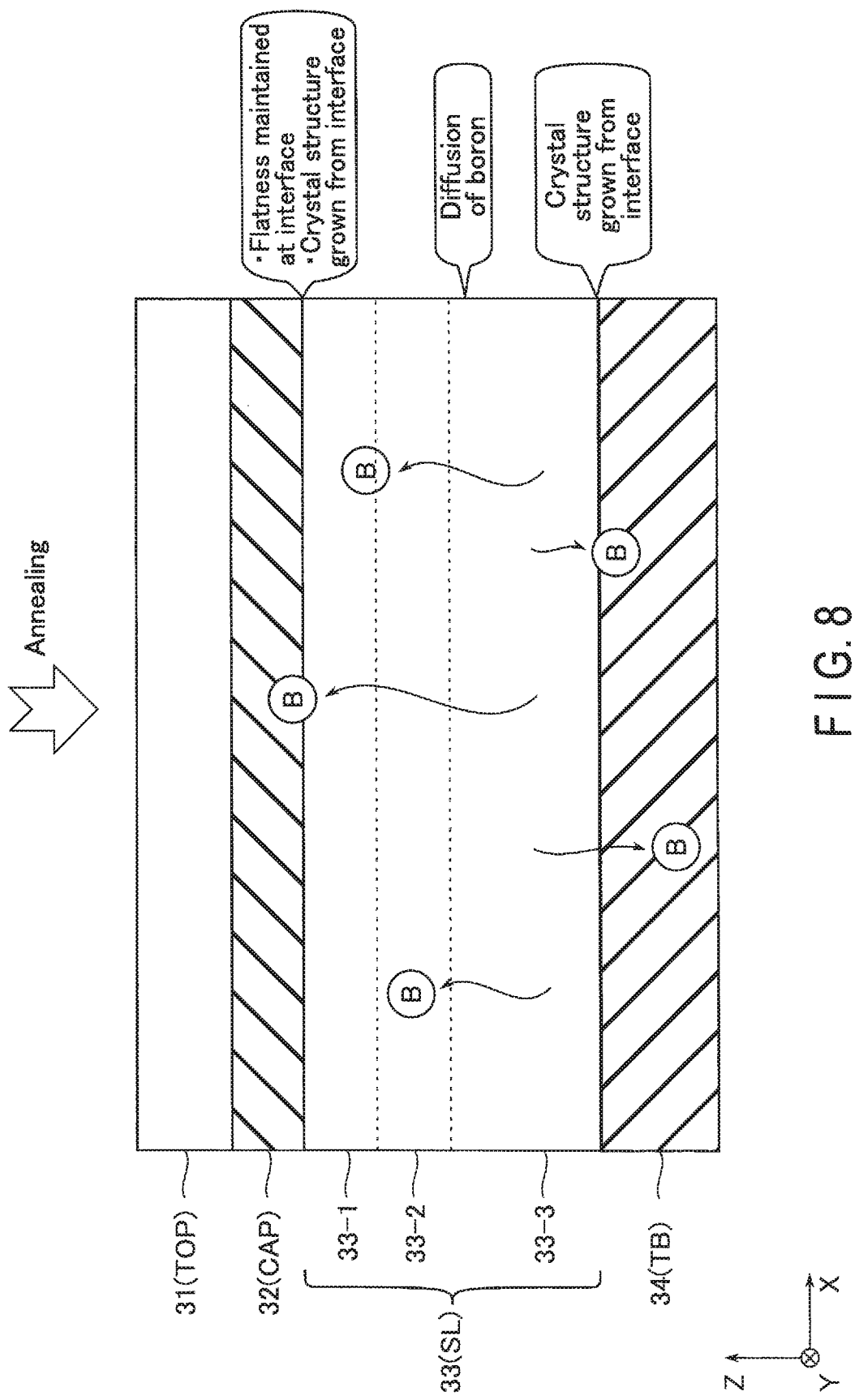
F I G. 8

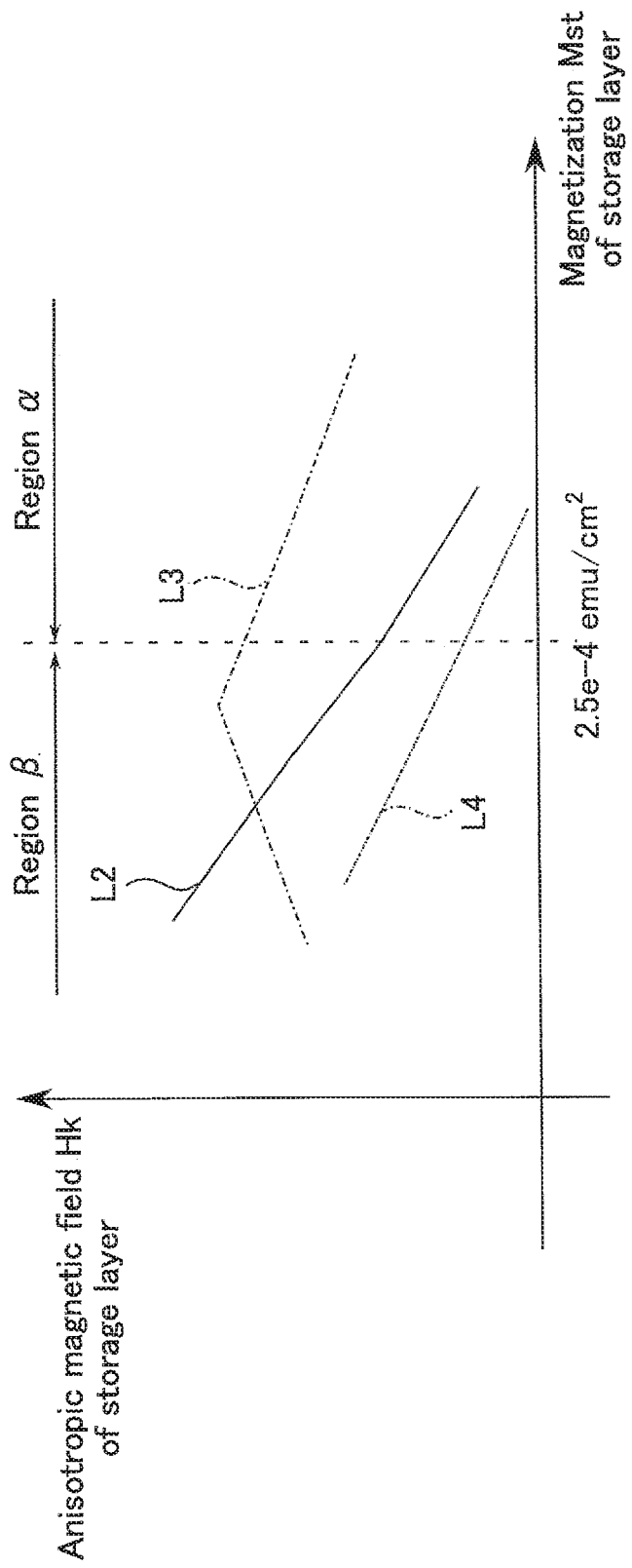
F I G. 9

MAGNETIC DEVICE WHICH IMPROVES WRITE ERROR RATE WHILE MAINTAINING RETENTION PROPERTIES

CROSS-REFERENCE TO RELATED APPLICATIONS

This application is based upon and claims the benefit of priority from Japanese Patent Application No. 2019-165226, filed Sep. 11, 2019, the entire contents of which are incorporated herein by reference.

FIELD

Embodiments described herein relate generally to a magnetic device.

BACKGROUND

A magnetic device including magnetic elements is known.

BRIEF DESCRIPTION OF THE DRAWINGS

FIG. 2 is a circuit diagram illustrating a configuration of a memory cell array of the magnetic memory device according to the first embodiment.

FIG. 8 is a schematic diagram illustrating a method of manufacturing the magnetoresistive effect element in the magnetic memory device according to the first embodiment.

FIG. 9 is a schematic diagram illustrating an advantageous effect according to the first embodiment.

DETAILED DESCRIPTION

Figure 1:
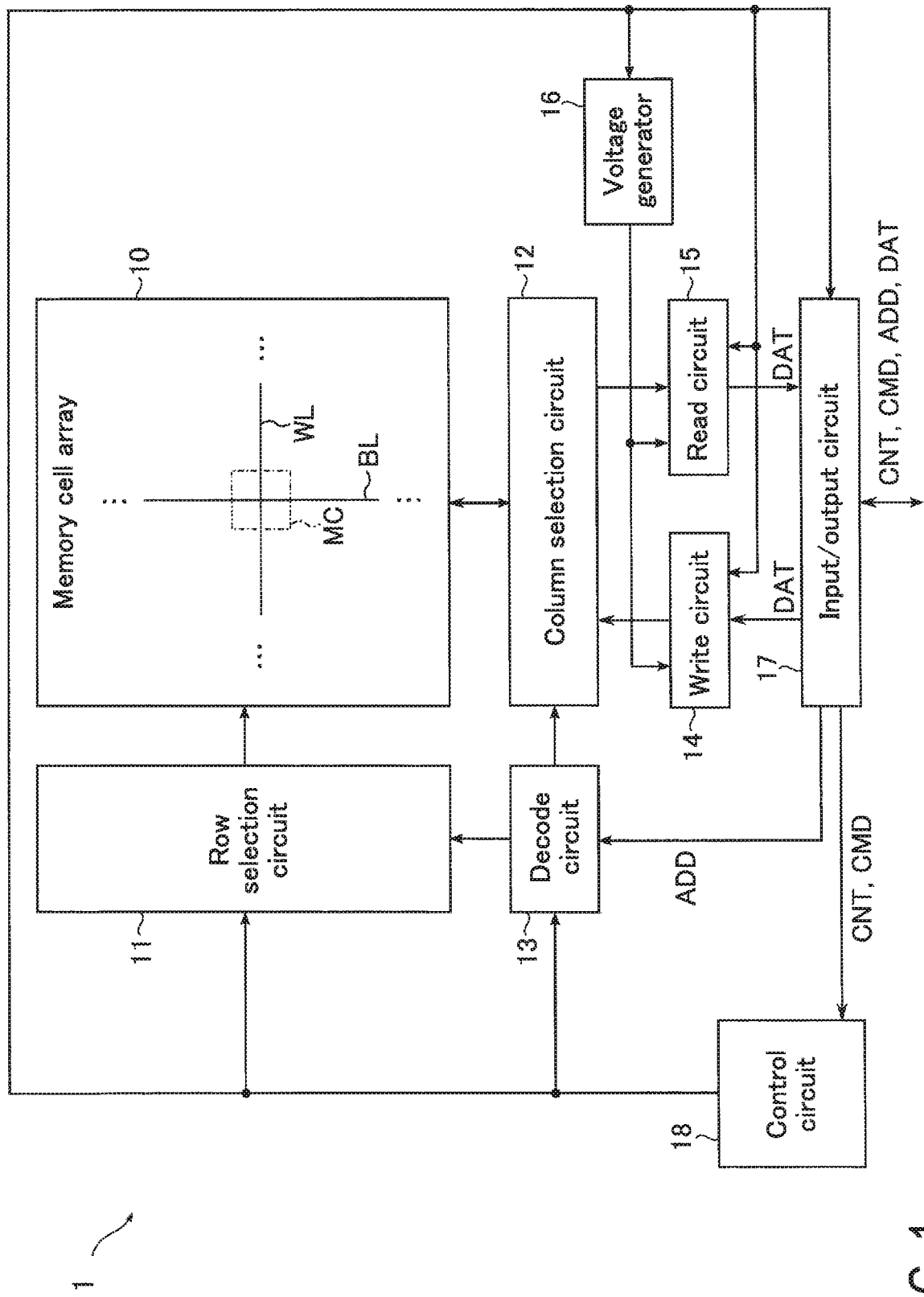
FIG. 1 is a block diagram illustrating a configuration of a magnetic memory device according to a first embodiment.

In general, according to one embodiment, a magnetic device includes a layer stack. The layer stack includes a first ferromagnetic layer, a second ferromagnetic layer, a first nonmagnetic layer between the first ferromagnetic layer and the second ferromagnetic layer, and a second nonmagnetic layer. The first ferromagnetic layer is interposed between the second nonmagnetic layer and the first nonmagnetic layer. The first nonmagnetic layer and the second nonmagnetic layer contain a magnesium oxide (MgO). The first ferromagnetic layer contains a higher amount of boron (B) at an interface with the first nonmagnetic layer than at an interface with the second nonmagnetic layer.

Embodiments will be described with reference to the accompanying drawings. In the description below, structural elements having the same functions and configurations will be denoted by common reference symbols. When multiple components with a common reference symbol need to be distinguished from one another, different suffixes are added to the common reference symbol to make such distinctions. When multiple components need not be particularly distinguished from one another, the multiple components are denoted only by the common reference symbol, without the addition of a suffix. Examples of such a suffix include a lower-case alphabetical letter applied at the end of a reference numeral and an index indicating arrangement, as well as a subscript and a superscript.

1. First Embodiment

A magnetic device according to a first embodiment will be described. Examples of the magnetic device according to the first embodiment include a magnetic memory device based on perpendicular magnetic technology, which uses, as variable resistance elements, elements that exhibit a magnetoresistive effect through magnetic tunnel junctions (MTJs) (referred to as "MTJ elements" or "magnetoresistive effect elements").

In the description that follows, the magnetic memory device will be described as an example of the magnetic device.

1.1. Configuration

First, a configuration of a magnetic memory device according to a first embodiment will be described.

1.1.1. Configuration of Magnetic Memory Device

FIG. 1 is a block diagram showing a configuration of a magnetic memory device according to a first embodiment. As shown in FIG. 1, a magnetic memory device 1 includes a memory cell array 10, a row selection circuit 11, a column selection circuit 12, a decode circuit 13, a write circuit 14, a read circuit 15, a voltage generator 16, an input/output circuit 17, and a control circuit 18.

The memory cell array 10 includes a plurality of memory cells MC each associated with a set consisting of a row and a column. Specifically, memory cells MC in the same row are coupled to the same word line WL, and memory cells MC in the same column are coupled to the same bit line BL.

The row selection circuit 11 is coupled to the memory cell array 10 via the word lines WL. The row selection circuit 11 is supplied with a decoded result of an address ADD (i.e., a row address) from the decode circuit 13. The row selection circuit 11 sets a word line WL in a row corresponding to the decoded result of the address ADD in a selected state. Hereinafter, the word line WL set in the selected state will be referred to as a "selected word line WL". Word lines WL other than the selected word line WL will be referred to as "non-selected word lines WL".

The column selection circuit 12 is coupled to the memory cell array 10 via the bit lines BL. The column selection circuit 12 is supplied with a decoded result of an address ADD (i.e., a column address) from the decode circuit 13. The column selection circuit 12 sets a bit line BL in a column corresponding to the decoded result of the address ADD in a selected state. Hereinafter, the bit line BL set in the selected state will be referred to as a "selected bit line BL". Bit lines BL other than the selected bit line BL will be referred to as "non-selected bit lines BL".

The decode circuit 13 decodes the address ADD from the input/output circuit 17. The decode circuit 13 supplies the decoded result of the address ADD to the row selection circuit 11 and the column selection circuit 12. The address ADD includes a column address and a row address to be selected.

The write circuit 14 writes data to the memory cells MC. The write circuit 14 includes, for example, a write driver (not illustrated).

The read circuit 15 reads data from the memory cells MC. The read circuit 15 includes, for example, a sense amplifier (not illustrated).

The voltage generator 16 generates voltages for various types of operations of the memory cell array 10, using a power supply voltage provided by an exterior portion (not illustrated) of the magnetic memory device 1. The voltage generator 16 generates, for example, a variety of voltages necessary for a write operation, and outputs the generated voltages to the write circuit 14. Also, the voltage generator 16 generates, for example, a variety of voltages necessary for a read operation, and outputs the generated voltages to the read circuit 15.

The input/output circuit 17 transfers an address ADD from the exterior portion of the magnetic memory device 1 to the decode circuit 13. The input/output circuit 17 transfers a command CMD from the exterior portion of the magnetic memory device 1 to the control circuit 18. The input/output circuit 17 transmits and receives a variety of control signals CNT between the exterior portion of the magnetic memory device 1 and the control circuit 18. The input/output circuit 17 transfers data DAT from the exterior portion of the magnetic memory device 1 to the write circuit 14, and outputs the data DAT transferred from the read circuit 15 to the exterior portion of the magnetic memory device 1.

Based on the control signals CNT and the command CMD, the control circuit 18 controls the operations of the row selection circuit 11, the column selection circuit 12, the decode circuit 13, the write circuit 14, the read circuit 15, the voltage generator 16, and the input/output circuit 17 in the magnetic memory device 1.

1.1.2. Configuration of Memory Cell Array

Next, a configuration of the memory cell array of the magnetic memory device according to the first embodiment will be described, with reference to FIG. 2. FIG. 2 is a circuit diagram showing a configuration of a memory cell array of the magnetic memory device according to the first embodiment. In FIG. 2, the word lines WL are distinguished from one another by suffixes each consisting of two lower-case alphabetical letters (i.e., "u" and "d") and an index ("< >").

As shown in FIG. 2, the memory cells MC (MCu and MCd) are arranged in a matrix pattern in the memory cell array 10, with each memory cell MC associated with a set consisting of one of the bit lines BL (BL<0>, BL<1>, ..., BL<N>) and one of the word lines WLd (WLd<0>, WLd<1>, ..., WLd<M>) and WLu (WLu<0>, WLu<1>, ..., WLu<M>), where M and N are any integers. That is, a memory cell MCd<i, j> (where 0≤i≤M and 0≤j≤N) is coupled between the word line WLd<i> and the bit line BL<j>, and the memory cell MCu<i, j> is coupled between the word line WLu<i> and the bit line BL<j>.

The suffixes "d" and "u" are designed to respectively distinguish between, for example, memory cells MC provided below the bit lines BL and memory cells MC provided above the bit lines BL. An example of a three-dimensional structure of the memory cell array 10 will be described later.

A memory cell MCd<i, j> includes a switching element SELd<i, j> and a magnetoresistive effect element MTJd<i, j> coupled in series. The memory cell MCu<i, j> includes a switching element SELu<i, j> and a magnetoresistive effect element MTJu<i, j> coupled in series.

During writing and reading of data to and from a corresponding magnetoresistive effect element MTJ, a switching element SEL functions as a switch that controls supply of a current to the magnetoresistive effect element MTJ. More specifically, a switching element SEL in a memory cell MC functions as an insulator with a large resistance value and interrupts a current (i.e., is turned off) when a voltage applied to the memory cell. MC is below a threshold voltage Vth, and functions as a conductor with a low resistance value and allows a current to flow therethrough (i.e., is turned on) when the voltage applied to the memory cell MC exceeds the threshold voltage Vth. That is, the switching element SEL has a function of switching between allowing and interrupting a current flow according to the magnitude of the voltage applied to the memory cell MC, regardless of the direction in which the current flows.

The switching element SEL may be, for example, a two-terminal type switching element having only two terminals. When a voltage applied between two terminals is less than a threshold value, the switching element is in a "high-resistance" state, e.g., in an electrically non-conductive state. When a voltage applied between two terminals is equal to or greater than the threshold value, the switching element is in a "low-resistance" state, e.g., in an electrically conductive state. The switching element may have this function regardless of the polarity of the voltage. For example, the switching element may contain at least one chalcogen element selected from the group consisting of tellurium (Te), selenium (Se), and sulfur (S). Alternatively, the switching element may contain a chalcogenide which is a compound containing such a chalcogen element.

The magnetoresistive effect element MTJ is capable of switching its resistance value between a low-resistance state and a high-resistance state, based on a current of which supply is controlled by the switching element SEL. The magnetoresistive effect element MTJ functions as a memory element that allows data to be written therein according to a change in its resistance state, retains the written data in a non-volatile manner, and allows the retained data to be read therefrom.

Figure 3:
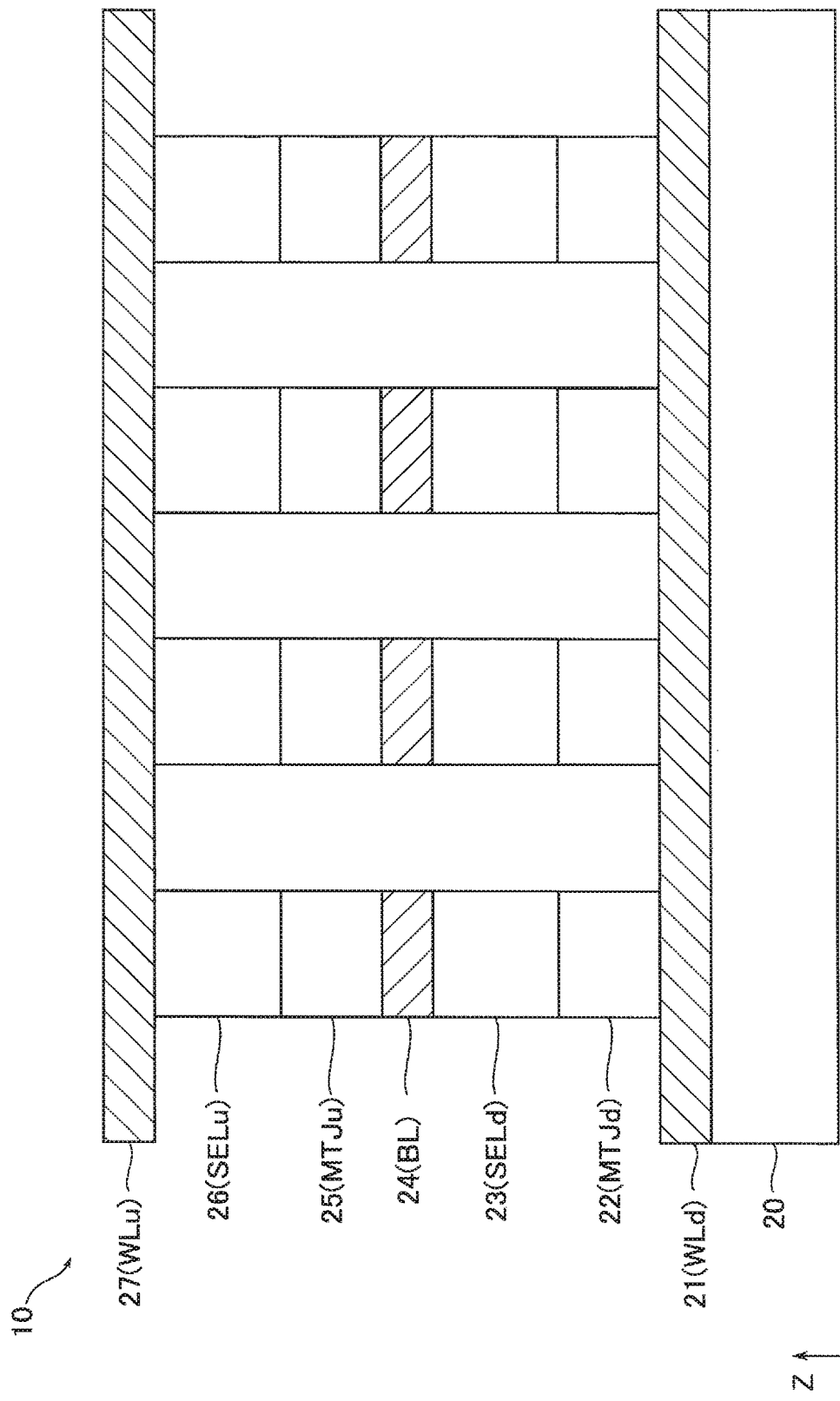
FIG. 3 is a cross-sectional view illustrating a structure of the memory cell array of the magnetic memory device according to the first embodiment.
Figure 4:
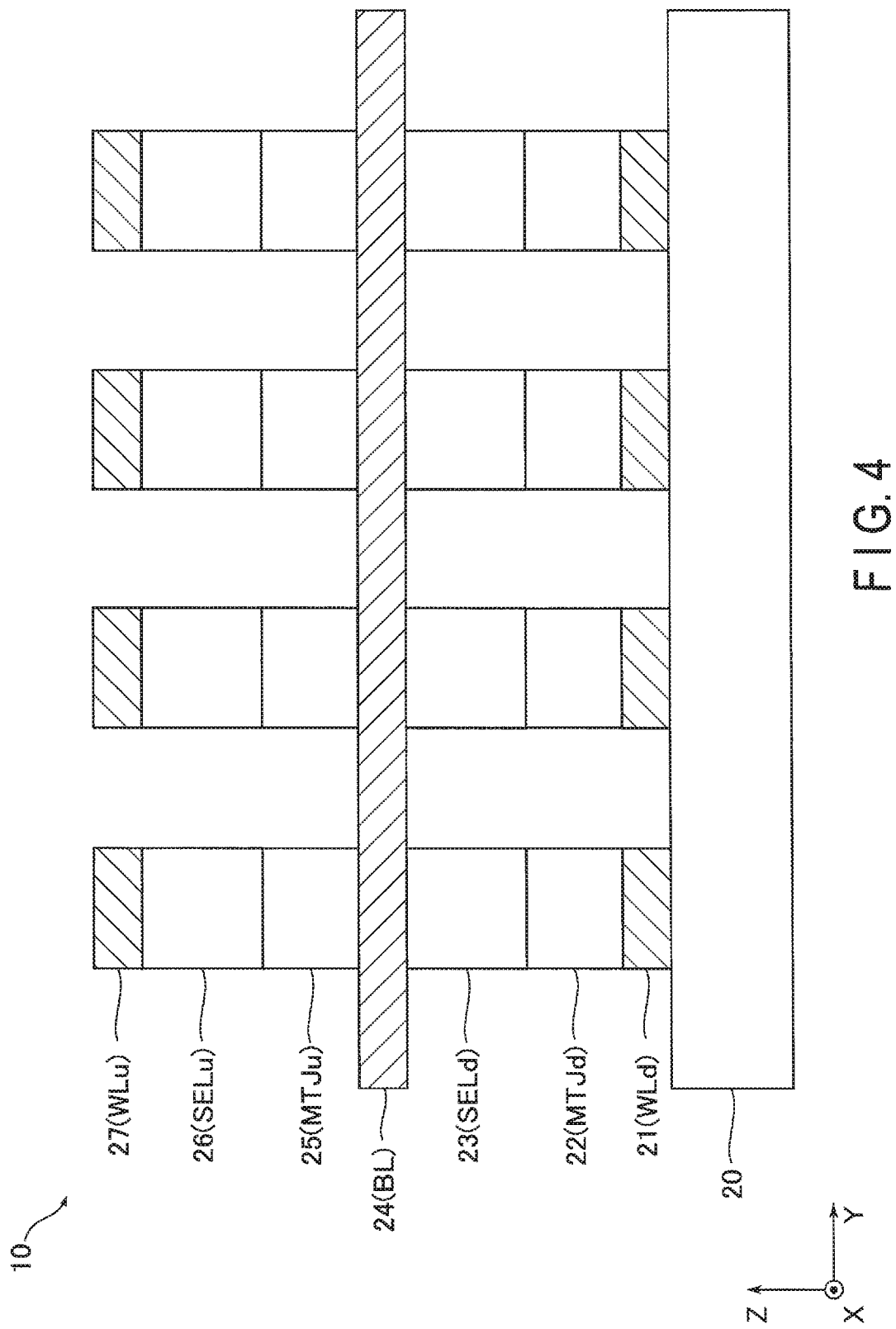
FIG. 4 is a cross-sectional view illustrating a structure of the memory cell array of the magnetic memory device according to the first embodiment.

Next, a cross-sectional structure of the memory cell array 10 will be described with reference to FIGS. 3 and 4. FIGS. 3 and 4 show an example of cross-sectional views illustrating structures of the memory cell array of the magnetic memory device according to the first embodiment. FIGS. 3 and 4 are cross-sectional views of the memory cell array 10 as viewed in different directions orthogonal to each other.

As shown in FIGS. 3 and 4, the memory cell array 10 is provided on a semiconductor substrate 20. In the description that follows, a plane parallel to a surface of the semiconductor substrate 20 is considered an "xy plane", and an axis perpendicular to the xy plane is considered a "z axis". On the xy plane, an axis extending along the word lines WL is considered an "x axis", and an axis extending along the bit lines BL is considered a "y axis". That is, FIGS. 3 and 4 are cross-sectional views of the memory cell array 10 taken along the y axis and the x axis, respectively.

A plurality of conductors 21, for example, are provided on an upper surface of the semiconductor substrate 20. The conductors 21 have conductivity, and function as word lines WLd. The conductors 21 are, for example, aligned along the y axis and extend along the x axis. A case has been described, with reference to FIGS. 3 and 4, where the conductors 21 are provided on the semiconductor substrate 20; however, the structure of the conductors 21 is not limited thereto. For example, the conductors 21 may be provided above the semiconductor substrate 20, without being in contact with the semiconductor substrate 20.

On an upper surface of each conductor 21, a plurality of elements 22, which respectively function as magnetoresistive effect elements MTJd, are provided. The elements 22 provided on the upper surface of the conductor 21 are, for example, aligned along the x axis. That is, a plurality of elements 22 aligned along the x axis are commonly coupled to an upper surface of a single conductor 21. The configuration of the elements 22 will be discussed in detail later.

A plurality of elements 23, which function as switching elements SELd, are provided on upper surfaces of corresponding elements 22. The upper surfaces of the elements 23 are coupled to a corresponding one of a plurality of conductors 24. The conductors 24 have conductivity, and function as bit lines BL. The conductors 24 are, for example, aligned along the x axis and extend along the y axis. That is, a plurality of elements 23 aligned along the y axis are commonly coupled to a single conductor 24. A case has been described, with reference to FIGS. 3 and 4, where each of the elements 23 is provided in contact with the corresponding element 22 and the corresponding conductor 24; however, the structure of the elements 23 is not limited thereto. For example, each of the elements 23 may be coupled to the corresponding element 22 and the corresponding conductor 24 via a conductive contact plug (not illustrated).

On an upper surface of each conductor 24, a plurality of elements 25, which function as magnetoresistive effect elements MTJu, are provided. The elements 25 provided on the upper surface of the conductor are, for example, aligned along the x axis. That is, a plurality of elements 25 aligned along the y axis are commonly coupled to an upper surface of a single conductor 24. Each element 25 has a structure similar to, for example, that of the element 22.

A plurality of elements 26, which function as switching elements SELu, are provided on upper surfaces of corresponding elements 25. The upper surfaces of the elements 26 are coupled to a corresponding one of a plurality of conductors 27. The conductors 27 have conductivity, and function as word lines WLu. The conductors 27 are, for example, aligned along the y axis and extend into the x axis. That is, a plurality of elements 26 aligned along the x axis are commonly coupled to a single conductor 27. A case has been described, with reference to FIGS. 3 and 4, where each of the elements 26 is provided in contact with the corresponding element 25 and the corresponding conductor 27; however, the structure of the elements 26 is not limited thereto. For example, each of the elements 26 may be coupled to the corresponding element 25 and the corresponding conductor 27 via a conductive contact plug (not illustrated).

With the above-described configuration, the memory cell array 10 attains a structure in which a single bit line BL corresponds to a set consisting of two word lines WLd and WLu. In the memory cell array 10, a memory cell MCd is provided between the word line WLd and the bit line BL, and a memory cell MCu is provided between the bit line BL and the word line WLu. That is, the memory cell array 10 has a structure in which a plurality of memory cells MC are provided at different heights as viewed on the z axis. In the cell structure shown in FIGS. 3 and 4, memory cells MCd are associated with lower layers, and memory cells MCu are associated with upper layers. That is, of two memory cells MC commonly coupled to a single bit line BL, a memory cell MC provided in layers above the bit line BL corresponds to a memory cell MCu to which the suffix "u" is added, and a memory cell MC provided in layers below the bit line BL corresponds to a memory cell MCd to which the suffix "d" is added.

1.1.3. Magnetoresistive Effect Element

Figure 5:
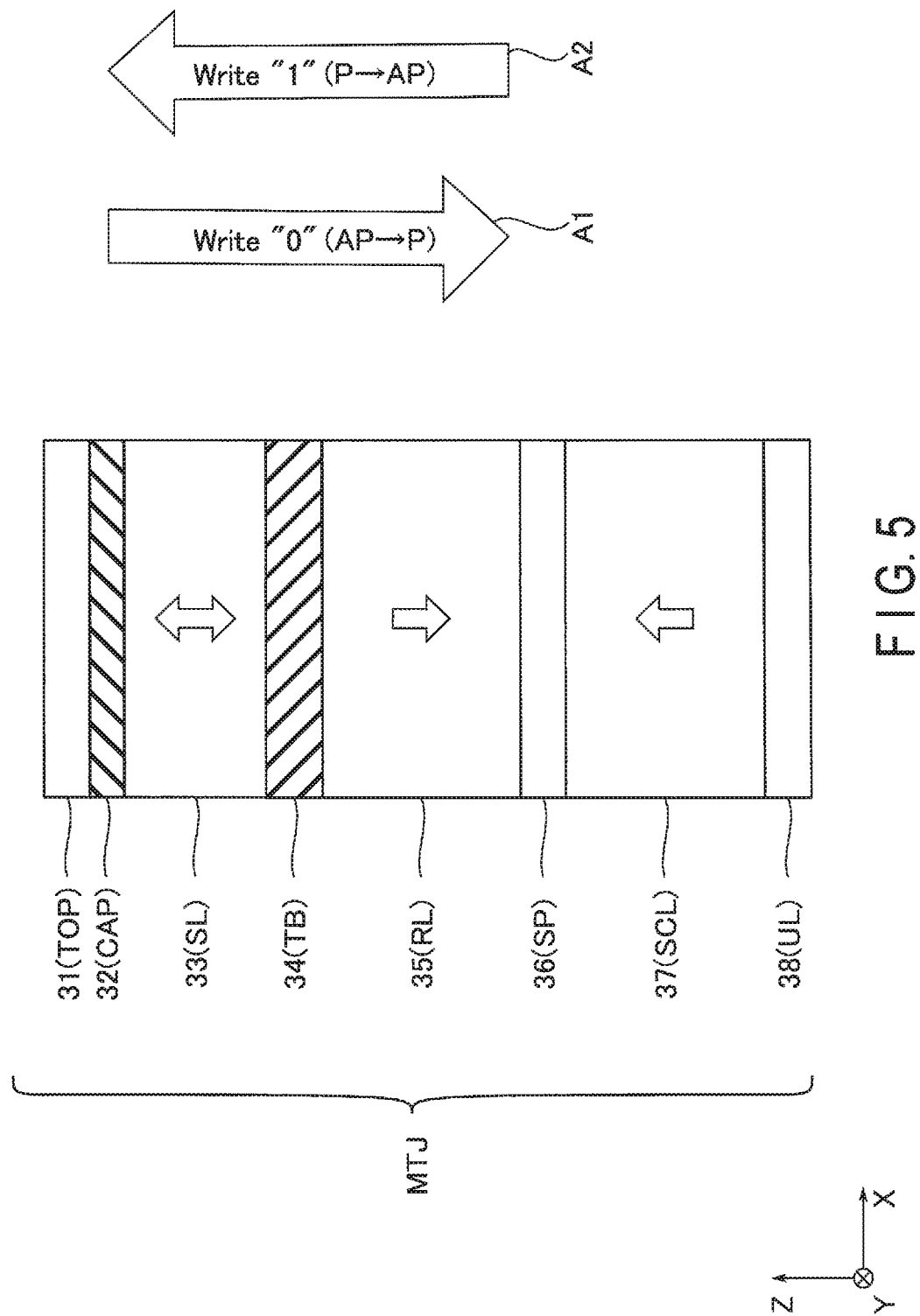
FIG. 5 is cross-sectional view illustrating a structure of a magnetoresistive effect element of the magnetic memory device according to the first embodiment.

Next, a structure of a magnetoresistive effect element of a magnetic device according to the first embodiment will be described, with reference to FIG. 5. FIG. 5 is a cross-sectional view showing a structure of a magnetoresistive effect element of a magnetic device according to the first embodiment. FIG. 5 shows an example of a cross section of the magnetoresistive effect element MTJd shown in, for example, FIGS. 3 and 4, cut along a plane perpendicular to the z axis (e.g., an xz plane). Since the magnetoresistive effect element MTJu has a structure similar to that of the magnetoresistive effect element MTJd, the illustration thereof is omitted.

As shown in FIG. 5, the magnetoresistive effect element MTJ includes, for example, a nonmagnet 31 which functions as a top layer TOP, a nonmagnet 32 which functions as a capping layer CAP, a ferromagnet 33 which functions as a storage layer SL, a nonmagnet 34 which functions as a tunnel barrier layer TB, a ferromagnet 35 which functions as a reference layer RL, a nonmagnet 36 which functions as a spacer layer SP, a ferromagnet 37 which functions as a shift canceling layer SCL, and a nonmagnet 38 which functions as an under layer UL.

The magnetoresistive effect element MTJd includes a plurality of films stacked in the order of, from the side of the word line WLd toward the side of the bit line BL (in the z-axis direction), the nonmagnet 38, the ferromagnet 37, the nonmagnet 36, the ferromagnet 35, the nonmagnet 34, the ferromagnet 33, the nonmagnet and the nonmagnet 31. The magnetoresistive effect element MTJu includes a plurality of films stacked in the order of, from the side of the bit line BL toward the side of the word line WLu (in the z-axis direction), the nonmagnet 38, the ferromagnet 37, the nonmagnet 36, the ferromagnet 35, the nonmagnet 34, the ferromagnet 33, the nonmagnet 32, and the nonmagnet 31. The magnetoresistive effect elements MTJd and MTJu function perpendicular-type magnetic MTJ elements in which, for example, the magnetization direction of magnets constituting the magnetoresistive effect elements MTJd and MTJu are perpendicular to the film plane. The magnetoresistive effect element MTJ may further include unillustrated layers between the layers 31-38.

The nonmagnet 31 is a non-magnetic metal, and contains at least one element selected from the group consisting of, for example, iridium (Ir), ruthenium (Ru), and rhodium (Rh). The nonmagnet 31 may have the function of improving a perpendicular magnetic anisotropy of the ferromagnet 33 when at least one of the above-listed elements is contained, compared to when tantalum (Ta), molybdenum (Mo), or the like is contained.

The nonmagnet 32 is a nonmagnet containing magnesium oxide (MgO), and may have a body-centered cubic (bcc) crystal structure (NaCl crystal structure with its film plane oriented in a (001) plane). During a crystallization process of the ferromagnet 33, the nonmagnet 32 functions as a seed material to be a nucleus for growth of a crystalline film from an interfade with the ferromagnet 33. During the crystallization process of the ferromagnet 33, the nonmagnet 32 has a function of maintaining flatness of the interface with the ferromagnet 33 well when magnesium oxide (MgO) is contained, compared to when a rare-earth oxide is contained. Since magnesium oxide (MgO) has insulating properties, it is desirable that the thickness of the nonmagnet 32 be several nanometers (nm) at most, from the viewpoint of reducing the resistance.

The nonmagnet 32 may further contain boron (B). During the crystallization process of the ferromagnet 33, the boron (B) is diffused from the ferromagnet 33, and is distributed into the nonmagnet 32.

The ferromagnet 33 has ferromagnetic properties, and has an easy axis of magnetization in a direction perpendicular to the film plane. The ferromagnet 33 has a magnetization directed toward either the side of the bit lines BL or the side of the word lines WL along the z axis. The ferromagnet 33 contains at least one of iron (Fe), cobalt (Co), and nickel (Ni), and the ferromagnet 33 further contains boron (B). More specifically, the ferromagnet 33 may contain, for example, iron cobalt boron (FeCoB) or iron boron (FeB), and have a body-centered crystal structure.

The ferromagnet 33 is designed in such a manner that a value of magnetization (Mst), which is the product of a saturation magnetization (Ms) and a film thickness (t), is less than a predetermined value. More specifically, the composition, the film thickness, etc. of the ferromagnet 33 are suitably adjusted in such a manner that the value of magnetization (Mct) becomes less than 2.5e-4 emu/cm$^2$.

The content of boron (B) in the ferromagnet 33 is not constant and continuously varies, as viewed on the z axis.

Figure 6:
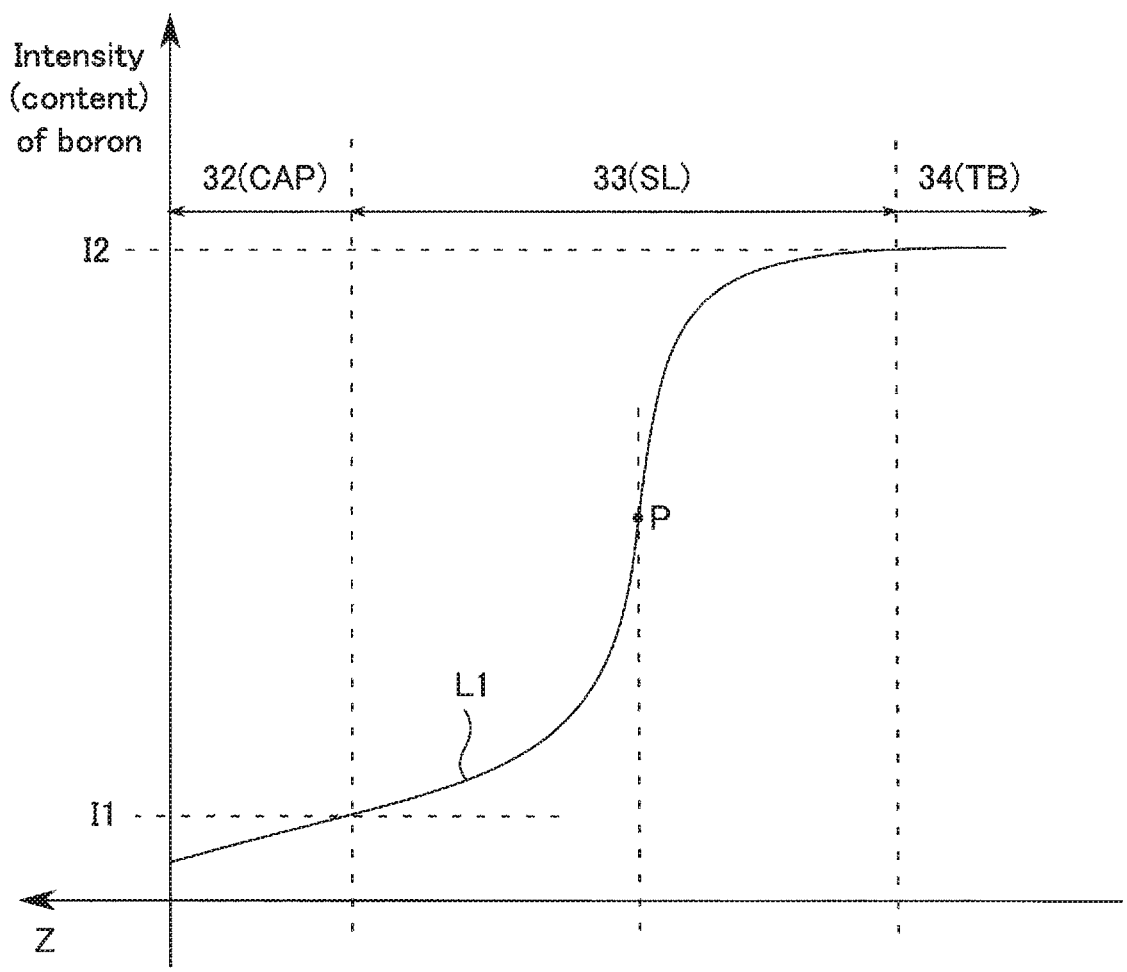
FIG. 6 is a diagram illustrating a distribution of boron in a storage layer of the magnetic memory device according to the first embodiment.

FIG. 6 is a diagram illustrating a content of boron (B) in a region including layer of the magnetic device according to the first embodiment. In FIG. 6, the horizontal axis represents a position of the magnetoresistive effect element MTJ along the z axis, and the vertical axis represents an index (an intensity) corresponding to the content of boron (B) at that position. An intensity distribution L1 of boron (B) shown along the z axis may be obtained by, for example, electron energy loss spectroscopy (EELS).

As shown in FIG. 6, the intensity of boron (B) in the magnetoresistive effect element MTJ may decrease from the nonmagnet 34 (denoted "34(TB)" in FIG. 6), through the ferromagnet 33 (denoted "33(SL)" in FIG. 6), toward the nonmagnet 32 (denoted "32(CAP)" in FIG. 6). More specifically, assuming that, for example, the intensity of boron (B) at the interface between the nonmagnet 32 and the ferromagnet 33 is I1 and the intensity of boron (B) at the interface between the ferromagnet 33 and the nonmagnet 34 is I2, the intensity I1 is lower than the intensity I2. In the ferromagnet 33, for example, a region with a relatively high intensity of boron (B) is present in the vicinity of the interface with the nonmagnet 34, and a region with a relatively low intensity of boron (B) is present in the vicinity of the interface with the nonmagnet 32. The intensity distribution L1 may, for example, monotonically decrease from the nonmagnet 34 toward the nonmagnet 32, and have an inflection point P at a point between the regions in the vicinity of the interfaces. The nonmagnet 34 may contain a higher amount of boron (B) than the nonmagnet 32.

Referring back to FIG. 5, the structure of the magnetoresistive effect element MTJ will be described.

The nonmagnet 34 is a nonmagnetic insulator containing, for example, magnesium oxide (MgO), and may further contain boron (B), as described above. Similarly to the nonmagnet 32, the nonmagnet 34 has an NaCl crystal structure with its film plane oriented in a (001) plane, and functions as a seed material to be a nucleus for growth of a crystalline film from an interface with the ferromagnet 33 during a crystallization process of the ferromagnet 33. The nonmagnet 34 is provided between the ferromagnet 33 and the ferromagnet 35, and forms, together with these two ferromagnets, a magnetic tunnel junction.

The ferromagnet 35 has ferromagnetic properties, and has an easy axis of magnetization in a direction perpendicular to the film plane. The ferromagnet 35 has a magnetization directed toward either the bit lines BL or the word lines WL along the z axis. The ferromagnet contains, for example, at least one of iron (Fe), cobalt (Co), and nickel (Ni). The ferromagnet 35 may further contain boron (B). More specifically, the ferromagnet 35 may contain, for example, iron cobalt boron (FeCoB) or iron boron (FeB), and have a body-centered crystal structure. The magnetization direction, of the ferromagnet 35 is fixed, and is toward the direction of the ferromagnet 37 in the example of FIG. 5. The "magnetization direction" being "fixed" means that the magnetization direction is not varied by a current (spin torque) of a magnitude that could invert the magnetization direction of the ferromagnet 33.

The ferromagnet 35 may be a layer stack constituted by a plurality of layers, although not illustrated in FIG. 5. Specifically, a layer stack configuring the ferromagnet 35 may be, for example, a structure including a layer containing iron cobalt boron (FeCoB) or iron boron (FeB) as an interface layer with the nonmagnet 34, and including an additional ferromagnet stacked between the interface layer and the nonmagnet 36 via a nonmagnetic conductor. The nonmagnetic conductor in the stacked layer constituting the ferromagnet 35 may contain at least one metal selected from the group consisting of, for example, tantalum (Ta), hafnium (Hf), tungsten (W), zirconium (Zr), molybdenum (Mo), niobium (Nb), and titanium (Ti). The additional ferromagnet in the layer stack configuring the ferromagnet 35 may contain at least one multilayer film selected from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnet 36 is a non-magnetic conductor, and contains at least one element selected from the group consisting of, for example, ruthenium (Ru), osmium (Os), iridium (Ir), vanadium (V), and chromium (Cr).

The ferromagnet 37 has ferromagnetic properties, and has an easy axis of magnetization in a direction perpendicular to the film plane. The ferromagnet 37 has a magnetization directed toward either the bit lines BL or the word lines WL along the z axis. The magnetization direction of the ferromagnet 37 is fixed, similarly to the ferromagnet 35, and is toward the direction of the ferromagnet 35 in the example of FIG. 5. The ferromagnet 37 contains at least one alloy selected from the group consisting of, for example, cobalt platinum (CoPt), cobalt nickel (CoNi), and cobalt palladium (CoPd). The ferromagnet 37 may be a layer stack constituted by a plurality of layers, similarly to the ferromagnet 35. In this case, the ferromagnet 37 may contain at least one multilayer film selected, from the group consisting of, for example, a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnets 35 and 37 are antiferromagnetically coupled by the nonmagnet 36. That is, the ferromagnets 35 and 37 are coupled to have magnetizations directed antiparallel to each other. Accordingly, the magnetization directions of the ferromagnets 35 and 37 are opposite to each other in the example of FIG. 5. Such a coupling structure of the ferromagnet 35, the nonmagnet 36, and the ferromagnet 37 is referred to as a synthetic anti-ferromagnetic (SAF) structure. This allows the ferromagnet 37 to compensate for the effect of the stray field of the ferromagnet 35 on the magnetization direction of the ferromagnet 33. It is thus possible to suppress the occurrence of asymmetry in the ease with which the magnetization of the ferromagnet 33 rotates, which could be caused by a stray field, etc. of the ferromagnet 35 (i.e., the ease with which the magnetization direction of the ferromagnet 33 rotates differs according to when rotation is made from one to the other and when rotation is made in the opposite direction).

The nonmagnet 38 is a nonmagnetic conductor, and has a function as an electrode for improving electrical connectivity between the bit line BL and the word line WL. The nonmagnet 38 contains, for example, a high-melting-point metal. The high-melting-point metal is a material having a melting point higher than that of iron (Fe) and cobalt (Co), and includes at least one element selected from the group consisting of, for example, zirconium (Zr), hafnium (Hf), tungsten (W), chromium (Cr), molybdenum (Mo), niobium (Nb), titanium (Ti), tantalum (Ta), vanadium (V), ruthenium (Ru), and platinum (Pt).

The first embodiment adopts a spin injection write technique, in which a write current is allowed to directly flow through the magnetoresistive effect element MTJ, and a spin torque is injected into the storage layer SL and the reference layer RL by the write current, thereby controlling the magnetization directions of the storage layer SL and the reference layer RL. The magnetoresistive effect element MTJ may take either a low-resistance state or a high-resistance state, according to whether the relative relationship between the magnetization direction of the storage layer SL and the magnetization direction of the reference layer RL is parallel or antiparallel.

When a write current Ic0 of a certain magnitude is allowed to flow through the magnetoresistive effect element MTJ in the direction of the arrow A1 in FIG. 5, namely, the direction from the storage layer SL toward the reference layer RL, the relative relationship between the magnetization direction of the storage layer SL and the magnetization direction of the reference layer RL becomes parallel. In this parallel state, the magnetoresistive effect element MTJ has the lowest resistance value, and the magnetoresistive effect element MTJ is set to a low-resistance state. This low-resistance state is called "parallel (P) state", and is defined as, for example, the state of data "0".

When a write current Ic1 of a magnitude greater than that of the write current Ic0 is allowed to flow through the magnetoresistive effect element MTJ in the direction of the arrow A2 in FIG. 5, namely, the direction from the reference layer RL toward the storage layer SL (opposite to the arrow A1), the relative relationship between the magnetization directions of the storage layer SL and the reference layer RL becomes antiparallel. In this antiparallel state, the magnetoresistive effect element MTJ has the highest resistance value, and the magnetoresistive effect element MTJ is set to a high-resistance state. This high-resistance state is called an "antiparallel (AP) state", and is defined as, for example, the state of data "1".

A description will be given below in accordance with the above-described definition of data; however, the definition of data "1" and data "0" is not limited thereto. For example, the P state may be defined as data "1", and the AP state may be defined as data "0".

1.2. Method of Manufacturing Magnetoresistive Effect Element

Next, a method of manufacturing a magnetoresistive effect element of a magnetic memory device according to the first embodiment will be described. Of constituent elements in the magnetoresistive effect element MTJ, a description will be made of, in particular, the method of manufacturing the nonmagnet 34 (tunnel barrier layer TB) and layers thereabove, and a structure of layers stacked below the nonmagnet 34 will be omitted.

Figure 7:
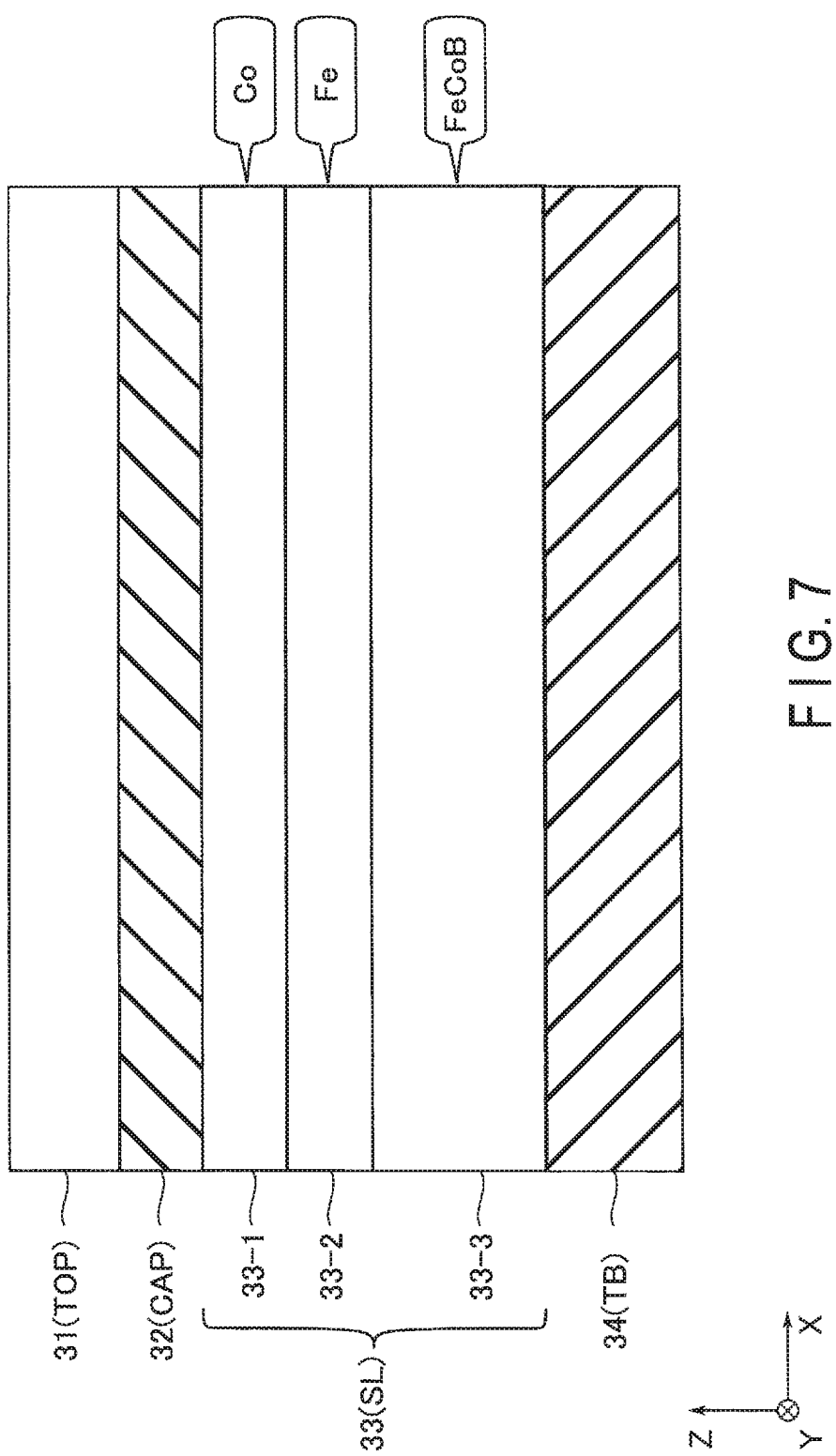
FIG. 7 is a schematic diagram illustrating a method of manufacturing the magnetoresistive effect element in the magnetic memory device according to the first embodiment.

FIGS. 7 and 8 are schematic diagrams illustrating a method of manufacturing the magnetoresistive effect element of the magnetic memory device according to the first embodiment. FIGS. 7 and 8 show a process by which the ferromagnet 33 changes from an amorphous state to a crystalline state through annealing process.

As shown in FIG. 7, a nonmagnet 34, a ferromagnet 33, a nonmagnet 32, and a nonmagnet 31 are stacked in this order above a semiconductor substrate 20.

As described above, the nonmagnets 34 and 32 have an NaCl crystal structure with its film plane oriented in a (001) plane. This allows the nonmagnets 34 and 32 to be configured in such a manner that magnesium (Mg) and oxygen (O) are alternately arranged at the interfaces with the ferromagnet 33.

The ferromagnet 33 is configured in such a manner that, for example, three ferromagnets (33-3, 33-2, and 33-1) with different compositions are stacked in an amorphous state.

More specifically, a ferromagnet 33-3 is formed on an upper surface of the nonmagnet 34. The ferromagnet 33-3 contains, for example, iron cobalt boron (FeCoB).

Subsequently, a ferromagnet 33-2 is formed on an upper surface of the ferromagnet 33-3. The ferromagnet 33-2 contains, for example, iron (Fe).

Subsequently, a ferromagnet 33-1 is formed on an upper surface of the ferromagnet 33-2. The ferromagnet 33-1 contains, for example, cobalt (Co).

The composition and the film thickness of each of the ferromagnets 33-1, 33-2, and 33-3 are suitably adjusted in such a manner that the value of magnetization list of the ferromagnet 33 as a layer stack becomes less than 2.5e-4 emu/cm$^2$.

A nonmagnet 32 is formed on an upper surface of the ferromagnet 33-1. The nonmagnet 32 is formed by, for example, depositing magnesium oxide (MgO) on the ferromagnet 33-1 by sputtering. In this case, the magnesium oxide (MgO) in the nonmagnet 32 can be formed stoichiometrically (i.e., without excessive oxidation of magnesium (Mg)). The nonmagnet 32 may be formed by, for example, chemical vapor deposition (CVD), as well as sputtering.

Next, as shown in FIG. 8, annealing process is performed on the layers stacked in FIG. 7. Specifically, the ferromagnet 33 is converted from an amorphous state into a crystalline state by heat applied to the layers from an exterior portion. The nonmagnets 34 and 32 serve to control the orientation of the crystal structure of the ferromagnet 33. That is, the crystal structure of the ferromagnet 33 is grown using the nonmagnets 34 and 32 as seed materials (crystallization process). In addition, the nonmagnet 32 suppresses aggregation of the ferromagnet 33 at the interface, thus serving to maintain flatness of the interface. Thereby, the ferromagnet 33 achieves a high tunnel magnetoresistance ratio (TMR), and a high perpendicular magnetic anisotropy occurs at both of the interface between the ferromagnet 33 and the nonmagnet 34 and the interface between the ferromagnet 33 and the nonmagnet 32.

In accordance with the crystallization of the ferromagnet 33 through annealing process, the elements in the ferromagnet 33, such as boron (B), are diffused into the surrounding layers (e.g., the ferromagnets 33-2 and 33-1 and nonmagnets 34 and 32). Thereby, the interface between the ferromagnet 33-1 and the ferromagnet 33-2 and the interface between the ferromagnet 33-2 and the ferromagnet 33-3 may become substantially indistinguishable. Through the diffusion, the content of elements in the ferromagnet 33, such as boron (B), are continuously distributed, as viewed on the z axis. More specifically, boron (B) is distributed in such a manner that the content of boron (B) is high in a region in which the ferromagnet 33-3 is provided, and decreases from a region in which the ferromagnet 33-2 is provided toward a region in which the ferromagnet 33-1 is provided.

1.3. Advantageous Effect of Present Embodiment

According to the first embodiment, the magnetoresistive effect element is capable of decreasing the product of the saturation magnetization and the film thickness, while maintaining the retention properties. This advantageous effect will be described with reference to FIG. 9.

FIG. 9 is a diagram illustrating an advantageous effect according to the first embodiment. In FIG. 9, lines L2, L3, and L4 are plotted, with the horizontal axis representing the value of magnetization (Mst) in the storage layer SL, and the vertical axis representing the magnitude of an anisotropic magnetic field (Hk) in the storage layer SL. The line L2 corresponds to the properties of the storage layer SL according to the first embodiment, and the lines L3 and L4 correspond to the properties of the storage layer SL according to comparative examples. The line L3 corresponds to a case where, for example, the capping layer CAP contains a rare-earth oxide, instead of magnesium oxide (MgO). The line L4 corresponds to a case where, for example, a ferromagnet not containing a significant amount of boron (B) (e.g., a layer containing a significant amount of iron (Fe) or cobalt (Co)) is formed, a ferromagnet containing a significant amount of boron (B) (e.g., a layer containing a significant amount of iron cobalt boron (FeCoB)) is formed on an upper surface of the ferromagnet not containing a significant amount of boron (B), and a capping layer CAP containing magnesium oxide (MgO) is formed on an upper surface of the ferromagnet containing a significant amount of boron (B).

As an index of evaluation of the properties of the storage layer SL, $Ic/\Delta$, for example, is used, where Ic denotes the magnitude of a write current, and $\Delta$ denotes the retention properties. In order to effectively store data, it is preferable that a write current Ic be decreased, and that the retention properties $\Delta$ be increased. That is, in order to effectively store data, it is requested that the index $Ic/\Delta$ be decreased. As another index of evaluation, of the properties of the storage layer SL, a write error rate WER, for example, is used. In general, the write error rate WER can be improved as the value of magnetization Mst decreases.

The retention properties $\Delta$ are correlated with the product of the value of magnetization Mst and the anisotropic magnetic field Hk. Accordingly, in a region with a small value of magnetization Mst (e.g., a region $\beta$ in which the value of magnetization Mst is less than 2.5e-4 emu$^2$) in FIG. 9, the index $Ic/\Delta$ of the storage layer SL decreases with an increasing anisotropic magnetic field Hk.

As shown in FIG. 9, the product of the value of magnetization Mst and the anisotropic magnetic field Hk (i.e., the retention properties $\Delta$) of the line L3 is greater than that of the line L2 in a region $\alpha$ in which the magnetization Mst is equal to or greater than 2.5e-4 emu/cm$^2$. However, the line L3 has decreased anisotropic magnetic field Hk in the region in which the value of magnetization Mst is less than 2.5e-4 emu/cm$^2$, compared to the region $\alpha$, resulting in a lower retention properties $\Delta$ than that of line L2. This is because, in the structure corresponding to the line L3 (structure in which a capping layer CAP contains a rare-earth oxide), a decrease in film thickness t of a storage layer SL causes aggregation of substances in the storage layer SL at the interface between the storage layer SL and the capping layer CAP during a crystallization process of the storage layer SL, thus deteriorating flatness at the interface. In this manner, it is possible, in the region $\beta$, to improve the write error rate WER while decreasing the index $Ic/\Delta$ when the capping layer CAP contains magnesium oxide (MgO), compared to when a rare-earth oxide is contained.

Since the line L4 corresponds to the case where the capping layer CAP contains magnesium oxide (MgO), the retention properties $\Delta$ of the region $\beta$ do not deteriorate, in contrast to the region $\alpha$. However, since the line L4 is positioned at the lower left as a whole, with respect to the line L2, the absolute value of the retention properties $\Delta$ is small. This is because the storage layer SL corresponding to the line L4 is configured in a multilayer structure in which a ferromagnet containing a significant amount of boron (B) is formed in a layer above the ferromagnet not containing a significant amount of boron (B). In this manner, it is possible, in the storage layer SL, to improve the write error rate WER while decreasing the index $Ic/\Delta$ when a ferromagnet not containing a significant amount of boron (B) is formed in a layer above the ferromagnet containing a significant amount of boron (B), compared to when a ferromagnet containing a significant amount of boron (B) is formed in a layer above the ferromagnet not containing a significant amount of boron (B), during film deposition.

According to the first embodiment, a magnetoresistive effect element MTJ is configured in such a manner that a nonmagnet 34, a ferromagnet 33, and a nonmagnet 32 are stacked in this order above a semiconductor substrate 20. The nonmagnet 32 contains magnesium oxide (MgO). This allows the nonmagnet 32 to promote growth of the crystal structure of the ferromagnet 33 and to maintain flatness of the interface with the ferromagnet 33 during crystallization of the ferromagnet 33. Thereby, the aggregation of the ferromagnet 33 is suppressed even when the value of magnetization Mst of the ferromagnet 33 is designed to be less than 2.5e-4 emu/cm$^2$. It is thus possible to obtain a high anisotropic magnetic field (Hk) in the region $\beta$, compared to when a rare-earth oxide is contained in the capping layer CAP (corresponding to the line L3 in FIG. 9), thereby maintaining increased retention properties $\Delta$. Also, it is possible to improve the write error rate WER while maintaining the increased retention properties $\Delta$.

During film deposition, the ferromagnet 33 is formed in such a manner that a ferromagnet 33-3 containing a significant amount of boron (B) and ferromagnets 33-1 and 33-2 not containing a significant amount of boron (B) are stacked along the z axis. Thereby, boron (B) is distributed in the crystallized ferromagnet 33 in such a manner that a higher amount of boron (B) is contained at the interface with the nonmagnet 34, than at the interface with the nonmagnet 32.

It is thus possible to obtain a high perpendicular magnetic anisotropy, compared to a storage layer SL in which boron (B) is distributed in such a manner that a higher amount of boron (B) is contained at the interface with the capping layer CAP than at the interface with the tunnel barrier layer TB (corresponding to the line L4 in FIG. 9).

It is thus possible to reduce the value of magnetization Mst while maintaining the retention properties Δ.

According to the first embodiment, a nonmagnet 31 is further formed on an upper surface of a nonmagnet 32. The nonmagnet 31 contains at least one element selected from the group consisting of iridium (Ir), ruthenium (Ru), and rhodium (Rh). This further improves the anisotropic magnetic field Hk of the storage layer SL in the region β, compared to when the nonmagnet 31 contains tantalum (Ta), molybdenum (Mo), or the like, instead of at least one of the above-described elements.

2. Modifications, Etc.

The above-described first embodiment is merely an example, and can be modified in various manners. Various modifications to which the first embodiment is applicable will be described. For convenience in explanation, mainly the differences from the first embodiment will be discussed.

2.1. First Modification

A case has been described where the ferromagnet 33-1 containing cobalt (Co) is formed on the upper surface of the ferromagnet 33-2 containing iron (Fe) in the ferromagnet 33 according to the first embodiment; however, the structure is not limited thereto.

Figure 10:
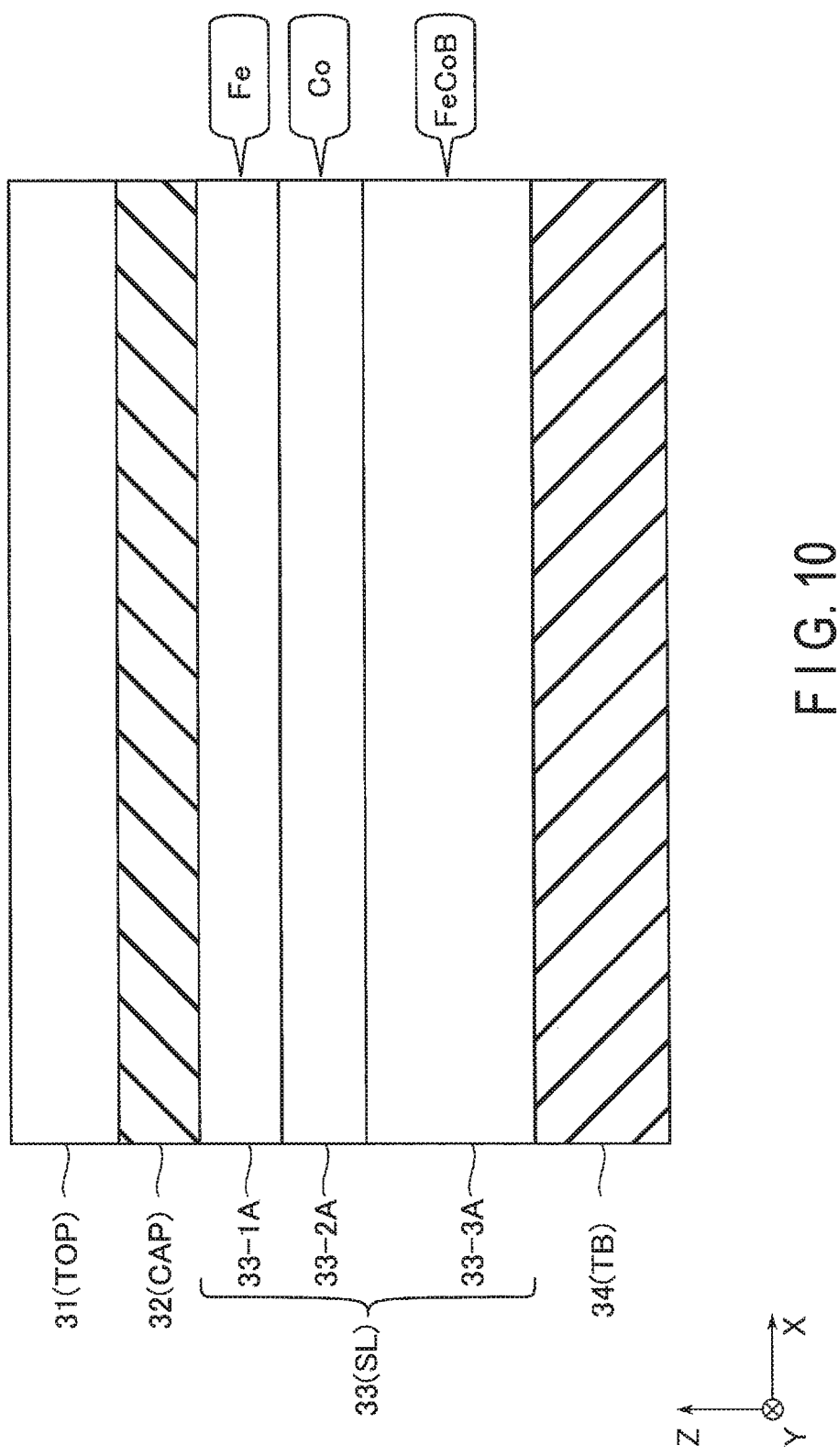
FIG. 10 is a schematic diagram illustrating a method of manufacturing a magnetoresistive effect element in a magnetic memory device according to a first modification.

FIG. 10 is a schematic diagram illustrating a method of manufacturing a magnetoresistive effect element of a magnetic memory device according to a first modification. FIG. 10 corresponds to FIG. 7 to which reference has been made in the first embodiment.

As shown in FIG. 10, a ferromagnet 33 is configured in such a manner that, for example, three ferromagnets (33-3A, 33-2A, and 33-1A) with different compositions are stacked in an amorphous state.

More specifically, a ferromagnet 33-3A is formed on an upper surface of a nonmagnet 34. The ferromagnet 33-3A contains, for example, iron cobalt boron (FeCoB).

Subsequently, a ferromagnet 33-2A is formed on an upper surface of the ferromagnet 33-3A. The ferromagnet 33-2A contains, for example, cobalt (Co).

Subsequently, a ferromagnet 33-1A is formed on an upper surface of the ferromagnet 33-2A. The ferromagnet 33-1A contains, for example, iron (Fe).

The composition and the film thickness of each of the ferromagnets 33-1A, 33-2A, and 33-3A are suitably adjusted in such a manner that the value of magnetization Mst of the ferromagnet 33 as a layer stack becomes less than 2.5e-4 emu/cm$^2$.

A nonmagnet 32 containing magnesium oxide (MgO) is formed on an upper surface of the ferromagnet 33-1A.

Even when the ferromagnet 33 is crystallized after the formation of the ferromagnets 33-3A to 33-1A, the distribution of boron (B) in the ferromagnet 33 is similar to the intensity distribution L1 shown in FIG. 6 to which reference has been made in the first embodiment. That is, even when a layer containing iron (Fe) and two ferromagnets containing cobalt (Co) are deposited in a vertically inverted manner with respect to the first embodiment, the same advantageous effect as that of the first embodiment can be produced.

2.2. Second Modification

A case has been described where three ferromagnets 33-1 to 33-3 are formed in the ferromagnet 33 according to the first embodiment; however, the structure is not limited thereto.

Figure 11:
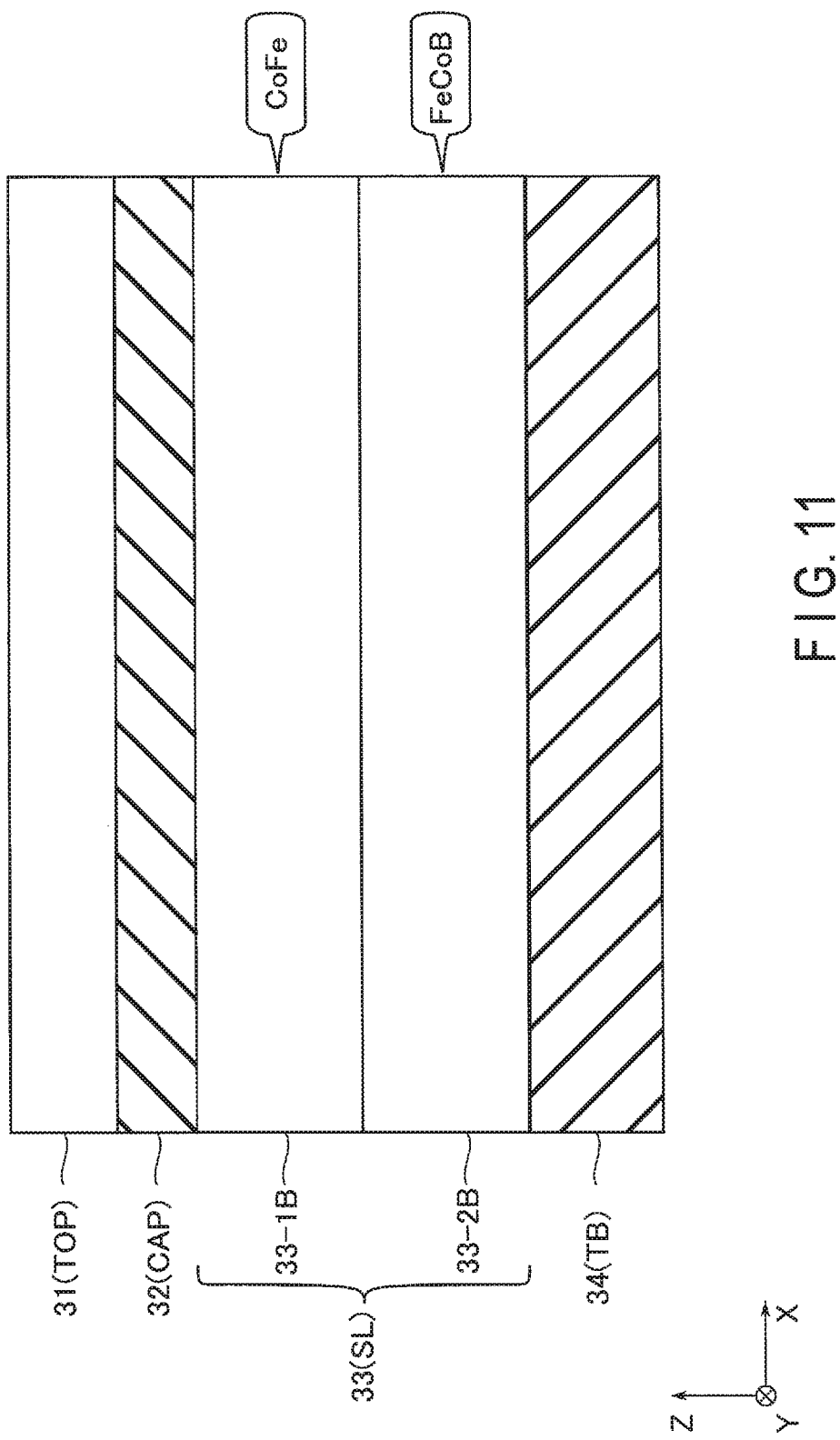
FIG. 11 is a schematic diagram illustrating a method of manufacturing a magnetoresistive effect element in a magnetic memory device according to a second modification.

FIG. 11 is a schematic diagram illustrating a method of manufacturing a magnetoresistive effect element of a magnetic memory device according to a second modification. FIG. 11 corresponds to FIG. 7 to which reference has been made in the first embodiment.

As shown in FIG. 11, the ferromagnet 33 is configured in such a manner that, for example, two ferromagnets (33-2B and 33-1B) with different compositions are stacked in an amorphous state.

More specifically, a ferromagnet 33-2B is formed on an upper surface of a nonmagnet 34. The ferromagnet 33-2B contains, for example, iron cobalt boron (FeCoB).

Subsequently, a ferromagnet 33-1B is formed on an upper surface of the ferromagnet 33-2B. The ferromagnet 33-1B contains, for example, cobalt iron (CoFe).

The composition and the film thickness of each of the ferromagnets 33-1B and 33-2B are suitably adjusted in such a manner that the value of magnetization Mst of the ferromagnet 33 as a layer stack becomes less than 2.5e-4 emu/cm$^2$.

A nonmagnet 32 containing magnesium oxide (MgO) is formed on an upper surface of the ferromagnet 33-1B.

Even when the ferromagnet 33 is crystallized after the formation of the ferromagnets 33-2B to 33-1B, a distribution of boron (B) in the ferromagnet 33 is similar to the intensity distribution L1 shown in FIG. 6 to which reference has been made in the first embodiment. That is, even when ferromagnets containing compounds of iron (Fe) and cobalt (Co) are deposited, as ferromagnets not containing a significant amount of boron (B), on an upper surface of a ferromagnet containing a significant amount of boron (B), an advantageous effect similar to that of the first embodiment can be produced.

2.3. Third Modification

A case has been described where a two-terminal switching element is employed as a switching element SEL in the memory cell MC according to the first embodiment; however, a metal-oxide-semiconductor (MOS) transistor may be employed as the switching element SEL. That is, the memory cell array is not limited to the structure including a plurality of memory cells MC at different heights as viewed in the z direction, and any other array structure may be employed.

Figure 12:
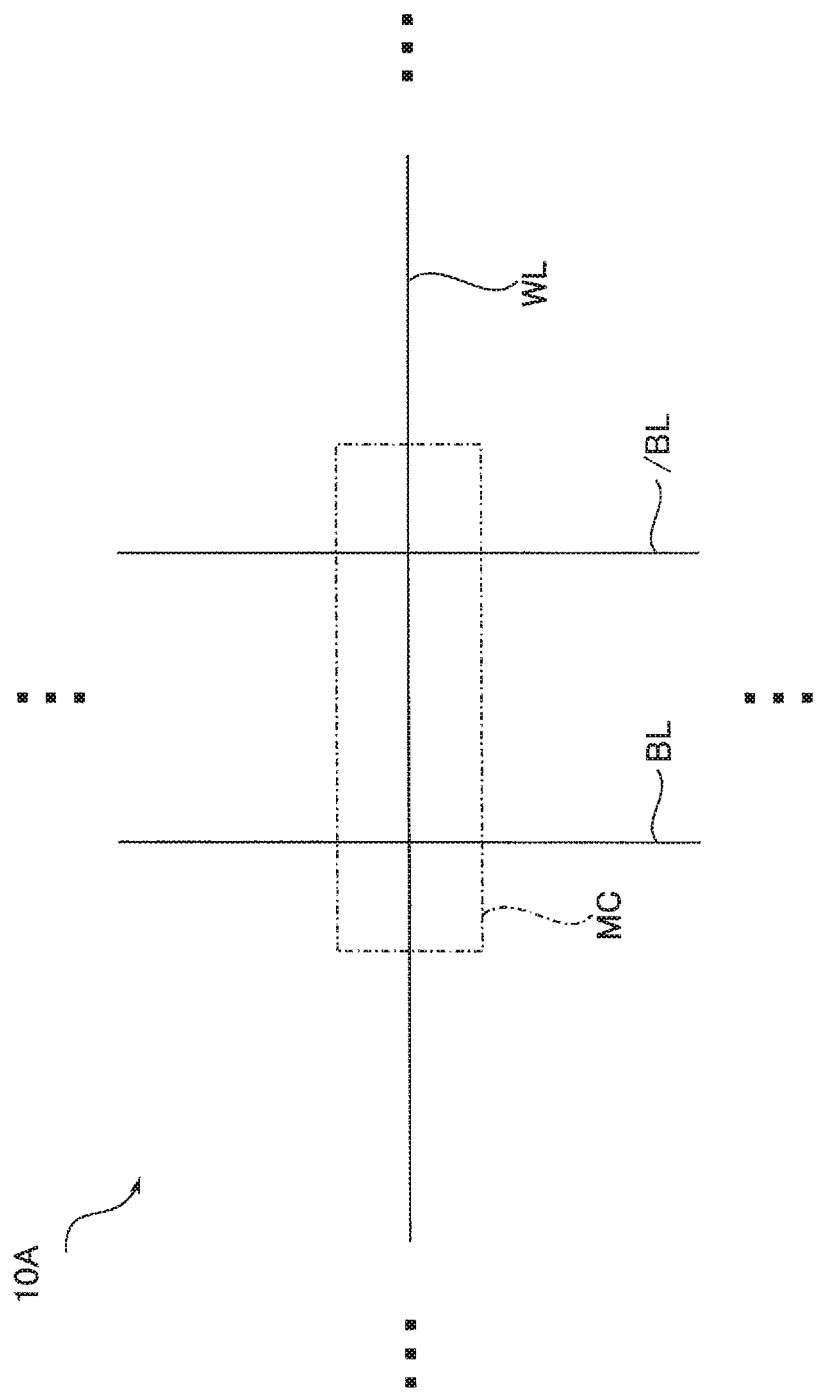
FIG. 12 is a schematic diagram illustrating a configuration of a memory cell array of a magnetic memory device according to a third modification.

FIG. 12 is a circuit diagram illustrating a configuration of a memory cell array of the magnetic memory device according to a third modification. FIG. 12 corresponds to the memory cell array 10 of the magnetic memory device 1 described in the first embodiment with reference to FIG. 1.

As shown in FIG. 12, a memory cell array 10A includes a plurality of memory cells MC each associated with a row and a column. Memory cells MC in the same row are coupled to the same word line WL, and both ends of memory cells MC in the same column are coupled to the same bit line BL and the same source line /BL.

Figure 13:
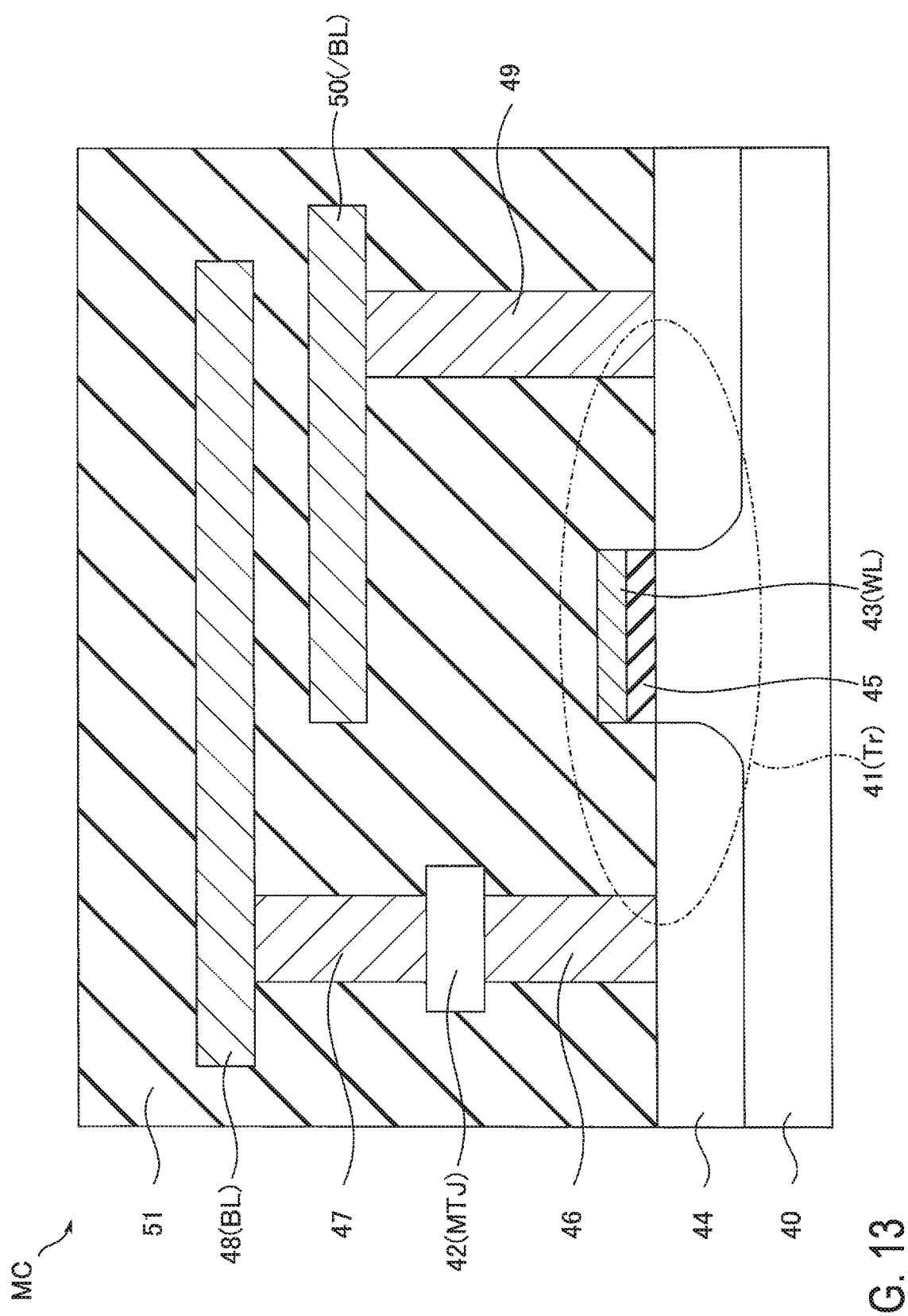
FIG. 13 is a cross-sectional view illustrating structure of a memory cell of the magnetic memory device according to the third modification.

FIG. 13 is a cross-sectional view illustrating a structure of a memory cell of the magnetic memory device according to a modification. FIG. 13 corresponds to the memory cell MC described in the first embodiment with reference to FIGS. 3 and 4. In the example of FIG. 13, memory cells MC are not stacked on the semiconductor substrate; therefore, suffixes such as "d" and "u" are not added.

As shown in FIG. 13, a memory cell MC is provided on a semiconductor substrate 40, and includes a select transistor 41 (Tr) and a magnetoresistive effect element 42 (MTJ). The select transistor 41 is provided as a switch that controls supply and interruption of a current during writing and reading of data to and from the magnetoresistive effect element 42. The structure of the magnetoresistive effect element 42 is similar to that of the magnetoresistive effect element MTJ shown in FIG. 5 of the first embodiment.

The select transistor 41 includes a gate (conductor 43) which functions as a word line WL, and a pair of source and drain regions (a diffusion region 44) provided on the semiconductor substrate 40 at both ends of the gate as viewed on the x axis. The conductor 43 is provided on an insulator 45 which functions as a gate insulating film provided on the semiconductor substrate 40. The conductor 43 extends along, for example, the y axis, and is commonly coupled to gates of select transistors of other unillustrated memory cells MC, in addition to the illustrated memory cell MC, aligned along the y axis. The conductors 43 are aligned along, for example, the x axis. A contact plug 46 is provided in the diffusion region 44 provided at a first end of the select transistor 41. The contact plug 46 is coupled onto a lower surface (first end) of the magnetoresistive effect element 42. A contact plug 47 is provided on an upper surface (second end) of the magnetoresistive effect element 42, and a conductor 48, which functions as a bit line BL, is coupled to an upper surface of the contact plug 47. The conductor 48 extends along, for example, the x axis, and is commonly coupled to second ends of magnetoresistive effect elements of other unillustrated memory cells, in addition to the illustrated memory cell, aligned along the x axis. A contact plug 49 is provided in the diffusion region 44 provided at a second end of the select transistor 41. The contact plug 49 is couples onto a lower surface of a conductor 50 which functions as a source line /BL. The conductor 50 extends along, for example, the x axis, and is commonly coupled to, for example, second ends of select transistors of other unillustrated memory cells, in addition to the illustrated memory cell, aligned along the x axis. The conductors 48 and 50 are aligned along, for example, the y axis. The conductor 48 is positioned, for example, above the conductor 50. The conductors 48 and 50 are arranged so as to avoid physical and electrical interference from each other, although not illustrated in FIG. 13. The select transistor 41, the magnetoresistive effect element 42, the conductors 43, 48 and 50, and the contact plugs 46, 47 and 49 are covered with an interlayer insulating film 51. Other unillustrated magnetoresistive effect elements aligned with the magnetoresistive effect element 42 along the x axis or the y axis are provided at, for example, the same level. That is, the magnetoresistive effect elements 42 are arranged, for example, on the xy plane in the memory cell array 10A.

With the above-described configuration, even when a MOS transistor, which is a three-terminal switching element, is employed as the switching element SEL, instead of a two-terminal switching element, an advantageous effect similar to that of the first embodiment can be produced.

2.4. Others

A case has been described where a magnetoresistive effect element MTJ is provided below a switching element SEL in the memory cells MC described in the above-described embodiments and its modifications; however, the magnetoresistive effect element MTJ may be provided above the switching element SEL.

Moreover, a magnetic memory device including an MTJ element has been described as an example of a magnetic device including a magnetoresistive effect element in the above-described first embodiment and its modifications; however, the magnetic device is not limited thereto. Examples of the magnetic device include other devices such as a sensor and a medium which requires magnetic elements having perpendicular magnetic anisotropy. Each of such magnetic elements includes, for example, at least the nonmagnet 32, the ferromagnet 33, the nonmagnet 34, and the ferromagnet 35, described with reference to FIG. 5.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic device comprising a layer stack, wherein:
   the layer stack includes:
      a first ferromagnetic layer;
      a second ferromagnetic layer;
      a first nonmagnetic layer between the first ferromagnetic layer and the second ferromagnetic layer; and
      a second nonmagnetic layer,
   the first ferromagnetic layer is interposed between the second nonmagnetic layer and the first nonmagnetic layer,
   the first nonmagnetic layer and the second nonmagnetic layer contain a magnesium oxide (MgO),
   the first ferromagnetic layer contains a higher amount of boron (B) at an interface with the first nonmagnetic layer than at an interface with the second nonmagnetic layer, and
   a product of a film thickness and a saturation magnetization in the first ferromagnetic layer is less than 2.5e-4 emu/cm$^2$.

2. The device of claim 1, wherein:
   the layer stack further includes a third nonmagnetic layer, the second nonmagnetic layer being interposed between the third nonmagnetic layer and the first ferromagnetic layer, and
   the third nonmagnetic layer contains at least one element selected from the group consisting of iridium (Ir), ruthenium (Ru), and rhodium (Rh).

3. The device of claim 1, wherein:
   the first ferromagnetic layer includes:
      a first portion; and
      a second portion between the first portion and the second nonmagnetic layer, and
   the first portion of the first ferromagnetic layer contains a higher amount of boron (B) than the second portion of the first ferromagnetic layer.

4. A magnetic device comprising a layer stack, wherein:
   the layer stack includes:
      a first ferromagnetic layer;
      a second ferromagnetic layer;

a first nonmagnetic layer between the first ferromagnetic layer and the second ferromagnetic layer; and
a second nonmagnetic layer,
the first ferromagnetic layer is interposed between the second nonmagnetic layer and the first nonmagnetic layer,
the first nonmagnetic layer and the second nonmagnetic layer contain a magnesium oxide (MgO),
the first ferromagnetic layer contains a higher amount of boron (B) at an interface with the first nonmagnetic layer than at an interface with the second nonmagnetic layer, and
an amount of boron (B) contained in the first ferromagnetic layer monotonically decreases from the first nonmagnetic layer toward the second nonmagnetic layer.

5. A magnetic device comprising a layer stack,
wherein:
the layer stack includes:
a first ferromagnetic layer;
a second ferromagnetic layer;
a first nonmagnetic layer between the first ferromagnetic layer and the second ferromagnetic layer; and
a second nonmagnetic layer,
the first ferromagnetic layer is interposed between the second nonmagnetic layer and the first nonmagnetic layer,
the first nonmagnetic layer and the second nonmagnetic layer contain a magnesium oxide (MgO),
the first ferromagnetic layer contains a higher amount of boron (B) at an interface with the first nonmagnetic layer than at an interface with the second nonmagnetic layer, and
the first nonmagnetic layer contains a higher amount of boron (B) than the second nonmagnetic layer.

6. The device of claim 1, wherein the first ferromagnetic layer is in contact with the first nonmagnetic layer and the second nonmagnetic layer.

7. The device of claim 6, wherein the second ferromagnetic layer is in contact with the first nonmagnetic layer.

8. The device of claim 1, wherein the first ferromagnetic layer and the second ferromagnetic layer contain at least one element selected from the group consisting of iron (Fe), cobalt (Co), and nickel (Ni).

9. The device of claim 1, wherein the first ferromagnetic layer takes a first resistance value in response to a first current flowing from the first ferromagnetic layer to the second ferromagnetic layer, and takes a second resistance value in response to a second current flowing from the second ferromagnetic layer to the first ferromagnetic layer.

10. The device of claim 9, wherein the first resistance value is less than the second resistance value.

11. The device of claim 1, wherein the first ferromagnetic layer is provided above the second ferromagnetic layer.

12. The device of claim 1, wherein:
the magnetic device comprises a memory cell, and
the memory cell includes:
a magnetoresistive effect element including the layer stack; and
a switching element coupled in series with the layer stack.

13. The device of claim 12, wherein the switching element comprises a two-terminal type switching element.

14. A magnetic device comprising a layer stack,
wherein:
the layer stack includes:
a first ferromagnetic layer;
a second ferromagnetic layer;
a first nonmagnetic layer between the first ferromagnetic layer and the second ferromagnetic layer;
a second nonmagnetic layer;
a third ferromagnetic layer; and
a fourth nonmagnetic layer between the second ferromagnetic layer and the third ferromagnetic layer,
the first ferromagnetic layer is interposed between the second nonmagnetic layer and the first nonmagnetic layer,
the first nonmagnetic layer and the second nonmagnetic layer contain a magnesium oxide (MgO),
the first ferromagnetic layer contains a higher amount of boron (B) at an interface with the first nonmagnetic layer than at an interface with the second nonmagnetic layer,
the second ferromagnetic layer and the third ferromagnetic layer have magnetizations in opposite directions, and
the fourth nonmagnetic layer contains at least one element selected from the group consisting of ruthenium (Ru), osmium (Os), iridium (Ir), vanadium (V), and chromium (Cr).

15. The device of claim 14, wherein the third ferromagnetic layer is provided below the second ferromagnetic layer.

16. The device of claim 4, wherein:
the layer stack further includes a third nonmagnetic layer, the second nonmagnetic layer being interposed between the third nonmagnetic layer and the first ferromagnetic layer, and
the third nonmagnetic layer contains at least one element selected from the group consisting of iridium (Ir), ruthenium (Ru), and rhodium (Rh).

17. The device of claim 4, wherein:
the first ferromagnetic layer includes:
a first portion; and
a second portion between the first portion and the second nonmagnetic layer, and
the first portion of the first ferromagnetic layer contains a higher amount of boron (B) than the second portion of the first ferromagnetic layer.

18. The device of claim 5, wherein:
the layer stack further includes a third nonmagnetic layer, the second nonmagnetic layer being interposed between the third nonmagnetic layer and the first ferromagnetic layer, and
the third nonmagnetic layer contains at least one element selected from the group consisting of iridium (Ir), ruthenium (Ru), and rhodium (Rh).

19. The device of claim 5, wherein:
the first ferromagnetic layer includes:
a first portion; and
a second portion between the first portion and the second nonmagnetic layer, and
the first portion of the first ferromagnetic layer contains a higher amount of boron (B) than the second portion of the first ferromagnetic layer.

20. The device of claim 14, wherein:
the layer stack further includes a third nonmagnetic layer, the second nonmagnetic layer being interposed between the third nonmagnetic layer and the first ferromagnetic layer, and
the third nonmagnetic layer contains at least one element selected from the group consisting of iridium (Ir), ruthenium (Ru), and rhodium (Rh).

* * * * *